United States Patent [19]

Bhatia

[11] Patent Number: 5,973,565
[45] Date of Patent: Oct. 26, 1999

[54] DC BIAS FEEDBACK CIRCUIT FOR MESFET BIAS STABILITY

[75] Inventor: Ratan Bhatia, Fremont, Calif.

[73] Assignee: Samsung Electronics Co., Lt., Seoul, Rep. of Korea

[21] Appl. No.: 08/940,333

[22] Filed: Sep. 30, 1997

[51] Int. Cl.⁶ .................................. H03F 3/16; H03F 1/30
[52] U.S. Cl. ............................................ 330/277; 330/290
[58] Field of Search ...................................... 330/277, 292, 330/296, 290

[56] References Cited

U.S. PATENT DOCUMENTS

| | | | |
|---|---|---|---|
| 4,921,814 | 5/1990 | Ishikawa et al. | 257/280 X |
| 5,412,235 | 5/1995 | Nakajima et al. | 330/277 X |
| 5,705,953 | 1/1998 | Jesser | 330/290 |

*Primary Examiner*—Steven J. Mottola
*Attorney, Agent, or Firm*—Townsend and Townsend and Crew LLP

[57] ABSTRACT

A DC bias feedback circuit stabilizes the $I_{ds}$ of an active MESFET with respect to process-dependent $I_{dss}$ variations to improve yield and reduce the effect of process variations.

3 Claims, 1 Drawing Sheet

DC BIAS FEEDBACK CIRCUIT FOR MESFET BIAS STABILITY

BACKGROUND OF THE INVENTION

The saturation current with no applied gate voltage, $I_{dss}$, between the source and drain of a field effect transistor (FET) is an important parameter of an FET. The value of $I_{dss}$ for a particular FET is process dependent. The value of source drain current when a gate voltage is applied, $I_{ds}$ is dependent on the characteristic $I_{dss}$ of the device; as $I_{dss}$ increases so does $I_{dss}$.

Various techniques, such as carefully controlling process variables or using large source resistors for biasing, have been proposed to limit the variation or effect of variation of $I_{dss}$. However, controlling $I_{dss}$ in process lowers yield and using large resistors increases power dissipation.

Accordingly, techniques to increase the $I_{dss}$ window are needed to increase yield.

SUMMARY OF THE INVENTION

According to one aspect of the invention, a negative feedback circuit compensates for process variations in $I_{dss}$ to improve $I_{ds}$ stability and process independence.

According to another aspect of the invention, a compensating current source is coupled to the source terminal of an FET to compensate for process variations in $I_{dss}$.

Other features and advantages of the invention will be apparent in view of the following detailed description and appended drawings.

DETAILED DESCRIPTION OF THE PREFERRED EMBODIMENTS

Figure 1:
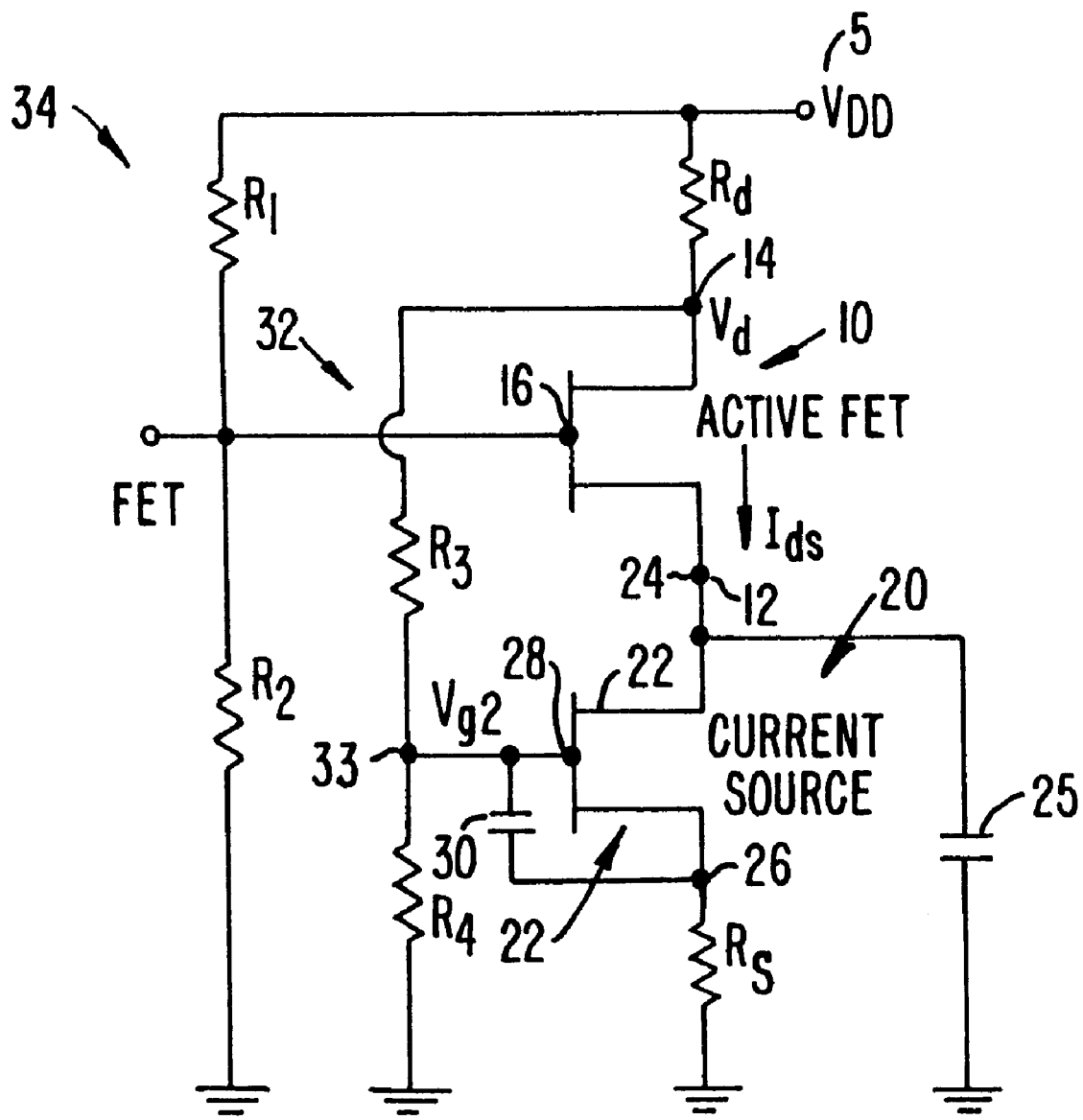
FIG. 1 is a circuit diagram of an embodiment of the invention.

A preferred embodiment of the invention is depicted in the circuit diagram of FIG. 1. Referring to FIG. 1, an active FET 10 has source, drain, and gate terminals 12, 14, and 16. The drain terminal 14 is coupled to a first terminal of a drain resistor Rd with the second terminal of Rd coupled to the VDD terminal of a power supply (not shown). The source terminal is coupled to a compensating current source 20.

The compensating current source 20 includes a second FET 22 matched to the active FET 10 and has its drain terminal 24 coupled to the source terminal 12 of the active FET 10 and to ground through a bypass capacitor 25. The source terminal 26 of the second FET 22 is coupled to the first terminal of a source resistor Rs with the second terminal of Rs coupled to ground. The first terminal of Rs is also coupled to the gate terminal 28 of the second FET through a capacitor 30.

The gate voltage of the second FET is set by a compensating voltage divider 32 including resistor R3 and R4 coupled at an output node 33. A first terminal of the compensating voltage divider 32 is coupled to the first terminal of the drain resistor Rd and the second terminal of the voltage divider 32 is coupled to ground. The output node 33 is coupled to the gate terminal 28 of the second FET 22. A bias generating voltage divider 34 is formed of resistors Ri and R2 and provide the bias voltage for the first FET 10.

The operation of the circuit depicted in FIG. 1 will now be described. The DC gate voltages of the active and second FETs 10 and 22 are determined by the bias and compensating voltage dividers. The values of R1, R2, R3, and R4 are selected generate bias voltages to set the steady state of $I_{ds}$ to a selected value. However, as described above, process-dependent variations of $I_{dss}$ will cause the value of the actual $I_{ds}$ to vary from the selected value.

As is well known, the voltage drop across Rd is proportional to the $I_{ds}$ flowing through the active FET 10 and the $I_{ds}$ of both the active FET 10 and the second FET 22 must be the same because of the series connection. Thus, if the actual value of $I_{ds}$ is greater than the selected value because of an undesired increase of $Id_{dss}$ then the voltage at the second terminal of Rd decreases. This decrease of voltage decreases the current flow through the compensating voltage divider 32 and decreases the gate voltage on the second FET 22. The $I_{ds}$ flowing through the second FET 22 is thus decreased which in turn reduces the $I_{ds}$ flowing through the active FET 10. Accordingly, the compensating current source 20 compensates the actual $I_{ds}$ to approximate the selected value of $I_{ds}$.

Conversely, if the value of the $I_{ds}$ of the active FET 10 is less than the selected value because of an undesired decrease in the value if $I_{dss}$ then the voltage at the second terminal of Rd increases. As described above, this voltage increase causes the $I_{ds}$ of the second transistor 22 to increase to compensate the actual value of $I_{ds}$ to approximate the selected value of $I_{ds}$.

Thus the compensating current source 20 always shifts $I_{ds}$ toward a stable, selected value. The inclusion of the compensating current source compensates for process variations in $I_{dss}$ to increase yield. Depending on the supply voltage, the resistance of R3, R4, and Rs are selected to provide a 50% improvement in $I_{ds}$ variations with respect to $I_{dss}$ variations.

The invention has now been described with reference to the preferred embodiments. Alternatives and substitutions will now be apparent to persons of ordinary skill in the art. Accordingly, it is not intended to limit the invention except as provided by the appended claims.

What is claimed is:

1. A compensating circuit for stabilizing the source drain current of an active metal semiconductor field effect transistor (MESFET) having source, drain, and gate terminals, said circuit comprising:

a drain resistor, having first and second terminals, with the first terminal coupled to the drain terminal of the active MESFET and a second terminal for coupling to a power supply voltage, said drain resistor for generating a voltage drop proportional to drain current through the active MESFET;

a compensating MESFET having source, drain, and gate terminals, with the drain terminal of the compensating MESFET coupled to the source terminal of the active MESFET;

a source resistor, having first and second terminals, with the first terminal coupled to the source terminal and capacitively coupled to the gate terminal of said compensating MESFET and the second terminal for coupling to ground; and a compensating voltage divider having a first terminal coupled to the first terminal of the drain resistor, a second terminal for outputting a fixed fraction of the voltage coupled to first terminal of compensating voltage divider, and a third terminal for coupling to ground, with the second terminal coupled to the gate of said compensating MESFET to provide a control voltage having a magnitude which varies reciprocally with the magnitude of the drain current in the active MESFET.

2. The circuit of claim 1 further comprising:

a bias voltage divider having a first terminal for coupling to a power supply voltage, a second terminal for outputting a fixed fraction of the supply voltage, and a third terminal for coupling to ground, with second terminal coupled to the gate terminal of said active MESFET to provide a DC bias voltage.

3. A compensation system for varying the value of the drain-source current of an active MESFET, having source and drain terminals, to compensate process-dependent variations in saturation current value, said system comprising:

a drain resistor coupling the drain terminal to a power supply voltage;

a compensation circuit comprising a compensating MESFET, coupled to said drain terminal and source terminal, responsive to a voltage drop across said drain resistor to stabilize the value of the drain-source current to a selected value.

* * * * *